United States Patent [19]

Kritchevsky et al.

[11] Patent Number: 4,678,699
[45] Date of Patent: Jul. 7, 1987

[54] STAMPABLE POLYMERIC COMPOSITE CONTAINING AN EMI/RFI SHIELDING LAYER

[75] Inventors: Gina R. Kritchevsky, Scotch Plains; John A. Gregor, Basking Ridge; Manfred W. Gruendig, Long Valley; Gregory J. Sellers, Clinton; Barbara Liss, Verona, all of N.J.

[73] Assignee: Allied Corporation, Morris Township, Morris County, N.J.

[21] Appl. No.: 690,388

[22] Filed: Jan. 11, 1985

Related U.S. Application Data

[63] Continuation of Ser. No. 436,238, Oct. 25, 1982, abandoned.

[51] Int. Cl.$^4$ ............................................. H05K 9/00
[52] U.S. Cl. .............................. 428/175; 174/35 GC; 174/35 MS; 264/241; 264/324; 428/229; 428/247; 428/251; 428/253; 428/256; 428/285; 336/84 C
[58] Field of Search ............... 428/175, 229, 247, 251, 428/253, 256, 285; 336/84 C; 174/35 GC, 35 MS; 264/241, 324

[56] References Cited

U.S. PATENT DOCUMENTS

| | | | |
|---|---|---|---|
| 3,126,440 | 3/1964 | Goodloe | 174/35 GC |
| 3,206,536 | 9/1965 | Goodloe | 174/35 GC |
| 3,230,294 | 1/1966 | McAdams | 174/35 GC |
| 3,435,127 | 3/1969 | Rose et al. | 428/256 |
| 3,436,467 | 4/1969 | Smith, Jr. | 174/35 |
| 3,487,186 | 12/1969 | Johnson et al. | 200/168 |
| 3,505,144 | 4/1970 | Kilduff et al. | 428/256 |
| 3,542,939 | 11/1970 | Mintz . | |
| 3,627,613 | 12/1971 | Stolkl et al. | 156/309 |
| 3,642,550 | 2/1972 | Doll . | |
| 3,666,550 | 5/1972 | Okuhashi et al. | 117/217 |
| 3,752,899 | 8/1973 | Bakker | 174/35 GC |
| 4,034,375 | 1/1971 | Wallin et al. | 343/18 A |
| 4,037,009 | 7/1977 | Severinsen | 428/256 |
| 4,096,304 | 6/1978 | Greengrass | 428/138 |
| 4,137,361 | 1/1979 | Deffeyes et al. . | |
| 4,189,618 | 2/1980 | Bretts et al. . | |
| 4,208,696 | 6/1970 | Lindsay et al. | 361/212 |
| 4,227,037 | 10/1980 | Layton | 174/35 MS |
| 4,240,857 | 12/1980 | DellaVecchia et al. | 156/209 |
| 4,312,913 | 1/1982 | Rheaume | 428/257 |

FOREIGN PATENT DOCUMENTS

| | | | |
|---|---|---|---|
| 710371 | 5/1965 | Canada | 174/35 MS |
| 052279 | 5/1982 | European Pat. Off. . | |
| 059063 | 9/1982 | European Pat. Off. . | |
| 2462890 | 12/1974 | Fed. Rep. of Germany | 174/35 MS |
| 2338123 | 2/1975 | Fed. Rep. of Germany | 174/35 MS |
| 48007 | 7/1980 | Japan | 174/35 MS |
| 1088408 | 10/1967 | United Kingdom | 174/35 MS |

OTHER PUBLICATIONS

Electronics, vol. 50, No. 5, Mar. 3, 1977, N.J. (USA).
Polymer-Plastics Technology and Engineering, vol. 17(1), 1–10 (1981); Columbus, Ohio, USA.

*Primary Examiner*—James C. Cannon
*Attorney, Agent, or Firm*—Richard A. Negin; Patrick L. Henry

[57] ABSTRACT

A stampable thermoplastic composite having at least one thermoplastic layer and at least one shielding layer. The shielding layer comprises a material having an elongation to break of at least 8 percent, and the composite having an EMI/RFI shielding effectiveness of at least 30 db.

16 Claims, 15 Drawing Figures

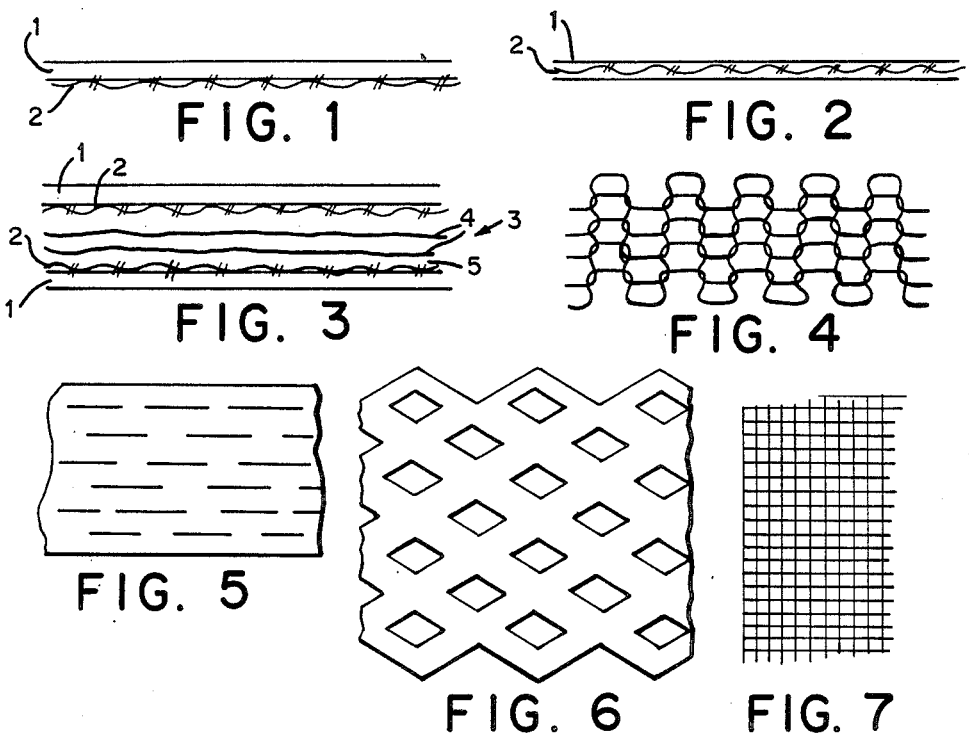
FIG. 1
FIG. 2
FIG. 3
FIG. 4
FIG. 5
FIG. 6
FIG. 7
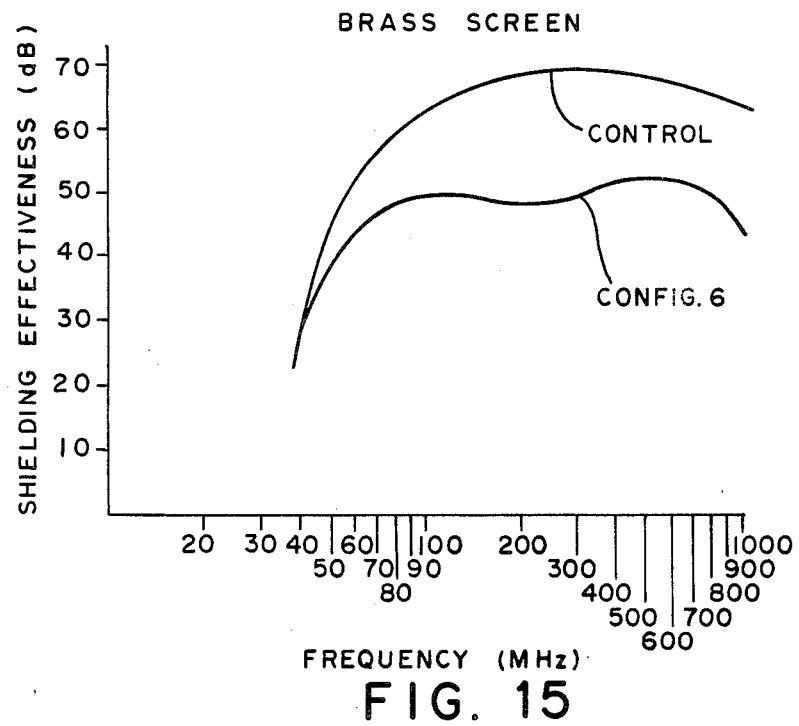
FIG. 15

STAMPABLE POLYMERIC COMPOSITE CONTAINING AN EMI/RFI SHIELDING LAYER

This application is a file wrapper continuation of application Ser. No. 436,238 filed Oct. 25, 1982, now abandoned.

BACKGROUND OF THE INVENTION

This invention is in the field of polymeric composites; more particularly, the invention relates to a stampable thermoplastic composite containing a shielding layer which can be stamped and provides effective shielding against electromagnetic and radio frequency radiation.

Electronic equipment can emit a variety of electromagnetic waves and radio frequency waves causing interference commonly called electromagnetic interference (EMI) and radio frequency interference (RFI). Efforts are continually under way to shield the various sources to prevent the EMI/RFI from affecting nearby electronic equipment. A common way to shield electronic equipment is to encase it in a material that shields electromagnetic and radio frequency waves.

One alternative is to locate electronic equipment in rooms that are shielded against the transmission of electromagnetic and radio frequency waves. This is sometimes difficult with smaller electronic apparatus and it is more desirable to localize the shielding around the particular apparatus. Various apparatus have been shielded by encasing them in metal containers. However metal containers tend to have difficulty being shaped, conduct electricity themselves, and can present a weight problem. As a result, new materials have been developed for shielding a variety of shaped electronic equipment including various electronic apparatus and cables. One product described is amorphous metal or metal glass. Various forms of this material can be shaped by rolling and stamping for use as EMI/RFI shielding material. Such material is discussed in *Electronics*, p. 138, Mar. 3, 1977 and in U.S. Pat. No. 4,189,618.

Conductive plastics are also used to make a variety of shaped EMI/RFI shields. Reference is made to Simon, R.M. *EMI Shielding Through Conductive Plastics*, Polym.-Plast. Technol. Eng., 17(1), 1-10 (1981). This article discusses EMI shielding using conductive plastics. Included in this article is a discussion of the fact that conductive fillers can be used such as powdered metal and carbon. This article additionally notes that graphite fibers provide a shielding advantage as well as a high strength reinforcement. This article also recognizes the use of metalized glasses in chopped form, roving, or mat. Finally, the article notes a fibrous conductive filler which is a pure metal or metal alloy flake or fiber. It is disclosed in this article that mat molding compounds can contain 5% of a flake product to give shielding in a 30 (decibel) dB range. It is also disclosed that flake and fiber based conductive polymers have been made using polypropylene, polycarbonate, nylon 66, nylon 6, nylon 12 and phenolic resins.

*Modern Plastics*, p. 58, June 1982 discloses conductive sheet molding compounds (SMC) shields against EMI/RFI. A particular disclosure is a sheet molding compound reinforced with 22% glass fiber, carbon fiber mat, conductive fillers and conductive carbon pigment. The use is for a housing for a computer printer.

SUMMARY OF THE INVENTION

The present invention is a stampable thermoplastic composite. There is at least one thermoplastic layer and at least one shielding layer. The shielding layer is preferably a fibrous or foraminous material and has an elongation to break of at least 8 percent. The composite has an EMI/RFI shielding effectiveness of at least 30 dB. The shielding layer must be able to maintain its shielding effectiveness upon stamping. Optionally, there can be additional layers such as reinforcing layers.

The shielding layer can be selected from suitable materials that meet its elongation and shielding effectiveness criteria. Preferred material include graphite fiber mat, nickel coated graphite fiber mat, metal fiber mat, knitted metal wire mesh and metal screen. Useful metal fibers for the mat, mesh, and screen include aluminum fibers, steel fibers, and tin coated copper clad steel fiber. Also included is woven thermoplastic preferably polyester, fabric containing interwoven metal fiber.

In an alternate embodiment, the shielding layer can be made of a perforated metal sheet. That is a metal sheet which contains a plurality of holes so that the sheet can be stretched to have an effective elongation at break of at least 8 percent in addition to a shielding effectiveness of at least 30 dB.

BRIEF DESCRIPTION OF THE DRAWINGS

FIG. 1 is a sectional view of an embodiment of the present invention containing a polymeric layer and the fibrous shielding layer adjacent to the polymeric layer.

FIG. 2 is an embodiment of the present invention disclosing a fibrous shielding layer embedded in a thermoplastic layer.

FIG. 3 is a preferred embodiment of the present invention showing a reinforced thermoplastic composite laminate containing two fibrous shielding layers.

FIG. 4 is a schematic drawing of a knitted wire mesh.

FIG. 5 is a shielding layer made of a perforated metal sheet with linear perforations.

FIG. 6 is a shielding layer made of the perforated metal sheet with the linear perforations open.

FIG. 7 is a shielding layer made of metal screen.

FIG. 9-15 are graphs of shielding effectiveness in decibels (db) vs. frequency in megahertz (MHz) for Examples 1-9. Each graph has a control curve and curves for the various configurations used in the Examples. The following configurations were tested:
1. Shielding layer alone;
2. Flat plastic laminate with one shielding layer;
3. Flat plastic laminate with two shielding layers;
4. Configuration 2 stamped into a bowl shape;
5. Configuration 3 stamped into a bowl shape;
6. Configuration 2 stamped into a box shape; and
7. Configuration 3 stamped into a box shape.

DESCRIPTION OF THE PREFERRED EMBODIMENT

Figure 8:
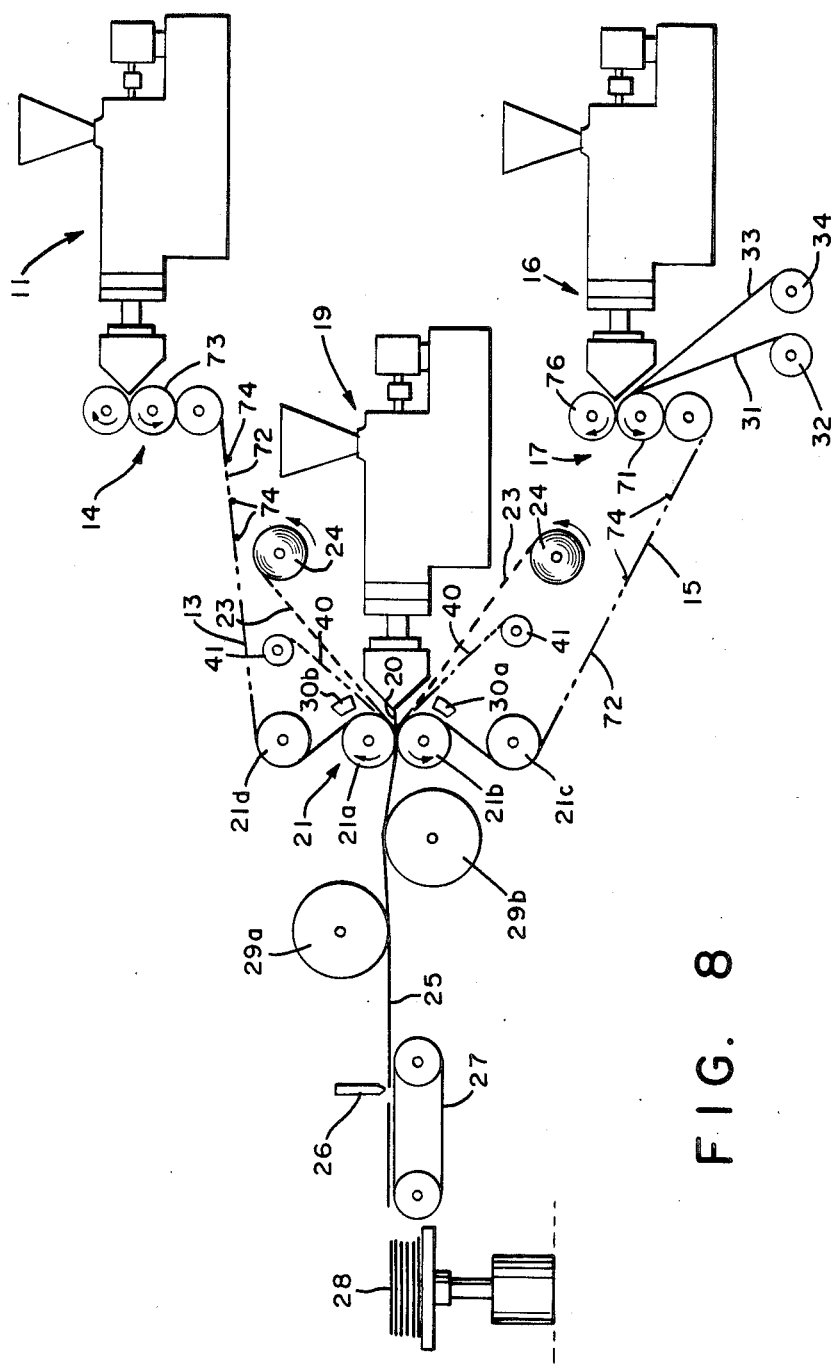
FIG. 8 is a schematic drawing showing a process useful in making a stampable thermoplastic composite of the type shown in FIG. 3.

In its most basic form, the present invention is a stampable thermoplastic composite comprising at least one thermoplastic layer and at least one shielding layer. Optionally, there can also be additional layers including a reinforcing layer.

A preferred embodiment of the present invention is a thermoplastic composite comprising at least one thermoplastic layer and at least one shielding layer made up of a fibrous or perforated material. The shielding layer should have an elongation to break of at least 8 percent and preferably from about 8 percent to about 250 percent. The shielding layer should result in a composite having a shielding effectiveness of at least 30 decibels (dB), preferably greater than 40 db. A preferred composite has a shielding effectiveness of from 40 to 70 decibels. The shielding layer preferably provides the required shield effectiveness to interference frequencies over at least part of the range of from 20 to 1000 MHz. The shielding effectiveness at a given frequency is measured as the difference between the decibels passing through an open hole and the decibels passing through a sample of shielding material. The shielding effectiveness at frequencies across a range or spectra can be measured and recorded on graphs as shown in FIGS. 9–15.

The shielding layer must have an elongation to break of at least 8 percent and preferably 8 to 250 percent so that the stampable thermoplastic composite can be stamped. For the purpose of the present invention elongation to break is meant the elongation of the shielding layer and not the material within the layer. For example shielding, where the shielding layer is a fibrous mat, the mat can elongate by the movement of the fibers therein rather than the elongation of the individual fibers themselves. Where the shielding layer is a metal wire mesh, the wire mesh can elongate by the slack in the knit straightening out rather than the particular metal fibers elongating. Where the shielding layer is a perforated metal sheet, the elongation can be the elongation measured as the holes in the sheet change shape rather than as the metal structure of the sheet moves. The minimum elongation is important so that the shielding layer does not tear during shaping. Holes formed upon tearing can dramatically reduce shielding effectiveness.

The fibrous material useful in the shielding layer includes graphite fiber mat, nickel coated graphite fiber mat, knitted metal wire mesh, metal screen, and nonwoven metal fiber mat. A preferred shielding layer is made of metal screen such as woven metal wire screen. The preferred metallic materials include but are not limited to aluminum, copper, steel and tin coated copper clad steel fibers and wires. Other electrical conducting metal wires and fibers can be used which result in a shielding layer which can elongate and which result in a composite having the required shielding effectiveness. Additionally, useful fabric includes thermoplastic woven fabric such as a nylon or polyester fabric having metallic fiber such as steel fiber woven throughout or blended with the thermoplastic fiber.

Thermoplastic fabrics containing metal fibers such as a polyester fabric having stainless steel fibers blended into the polyester fibers were found to be surprisingly effective. The shielding effectiveness of an article made of a stamped thermoplastic composite having a layer of fabric containing metal fibers was found to be higher than the shielding layer prior to lamination and stamping. It is believed that the thermoplastic fibers melt during processing, i.e., laminating and/or stamping. Upon melting the metal fibers are believed to contact each other forming a more effective shielding grid. A preferred laminate is one containing adjacent layers of metal fiber containing fabric. In this embodiment, it is believed that upon processing the metal fibers will contact each other with layers and between layers. Any conducting metal fiber can be used.

Another embodiment of the present invention, is a stampable polymeric composite comprising at least one thermoplastic layer and at least one shielding layer comprising a perforated metal sheet having a elongation to break of at least 8 percent, preferably 8 to 250 percent, and more preferably from 50 to 150 percent. The perforated metal sheet should result in a composite having an EMI/RFI shielding effectiveness of at least about 30 dB.

The composite of the present invention is preferably in the form of a sheet having a thermoplastic layer and the shielding layer. The construction of the sheet can vary depending on the use. Embodiments include a composite wherein the shielding layer is adjacent to the thermoplastic layer. Alternately, the shielding layer can be embedded in the thermoplastic layer. In addition to the thermoplastic layer and the shielding layer there can be a reinforcing layer, such layer. In addition to the thermoplastic layer and the shielding layer there can be a reinforcing layer, such as long fiberglass mat. In the preferred embodiment where there is a reinforcing layer, the shielding layer is sandwiched between an outer thermoplastic layer and the reinforcing layer.

The thermoplastic polymers which can be used in the thermoplastic layer of the laminates of the present invention and in accordance with the methods of the present invention include the various thermoplastic materials normally used in injection molding, extrusion, vacuum forming, blow molding, fiber spinning, or similar thermoplastic processing techniques.

Particularly desirable thermoplastics for the surface polymer film layer compositions are the polyamides, that is, polymers having regularly recurring amide groups as an integral part of the main groups as an integral part of the main chain. Polyamides such as nylon 6,6 (a condensation product of hexamethylene diamine and adipic acid) and nylon 6 (the polymerization product of epsilonaminocaproic acid or caprolactam) are examples of two polyamides or nylons.

Polyolefins may also be employed, including polymers and copolymers of ethylene, propylene, methylpentene and blends thereof. Other polymers which can be utilized include polyurethane, polysulfone, polycarbonate and linear polyesters such as polyethylene terephthalate and polybutlyene terephthalate; cellulose esters such as cellulose acetate, and cellulose propionate; halogenated polyolefins and polyacetals.

Additional thermoplastic resinous materials which may be utilized in making the surface polymer film layer of the invention include, ABS (acrylonitnitrile butadiene styrene) resins, polyphenylene oxide plus styrene resin (Noryl TM), the alkenyl aromatic resins typified by polystyrene, styrene copolymers, blends and graft copolymers the alkenyl aromatic resins typified by polystyrene copolymers, blends and graft copolymer of styrene and rubber and the like. The invention may be practiced utilizing polyvinyl chloride or copolymers of vinyl chloride or vinylidene chloride.

Also included in the term polymer are blends or copolymers of two or more polymeric materials. Illustrative of such polymers are polyethylene/polypropylene, ethylene-acrylic acid-vinylacetate terpolymers and the like.

The thermoplastic layer can contain 40 to 100 percent polymer, 0 to 45 percent of a well dispersed randomly oriented short glass fibers, and 0 to 50 percent of particulate filler. The polymer of the thermoplastic layer can include a variety of additives, including fillers and other minor additives.

While composites without filler may be formed, the most desirable sheets include filler. The functions of the particulate filler are: (1) to increase the modulus and stiffness of the composite sheet and (2) to provide a more economical composition.

Fillers may be selected from a wide variety of minerals, metals, metal oxides, siliceous materials, metal salts, and mixtures thereof. These fillers may optionally be treated with various coupling agents or adhesion promoters, as is known to those skilled in the art. Advantageous physical properties are achieved if the filler material has a Young's modulus of $10^7$ psi or greater and at least a Young's modulus twice as great as that of the polymer. Examples of fillers included in these categories are alumina, aluminum hydrates, feldspar, asbestos, talc, calcium carbonates, clay, carbon black, quartz, novaculite and other forms of silica, kaolinite, bentonite, garnet, mica, saponite, beidellite, calcium oxide, calcium hydroxide, wollastonite, etc. A preferred filler is glass microspheres. The foregoing recited fillers are illustrative only and are not meant to limit the scope of fillers that can be utilized in this invention.

Other minor additives which may be of value in sheet formulations include antistatic agents, plasticizers, lubricants, nucleating agents, impact modifiers, colorants, heat and light stabilizers, or other similar processing aids and adjuvants.

Pigments such as carbon black are useful to hide the fiber veil which is immediately below the polymer film.

With sheets formed of polycaprolactam (nylon 6), it is preferred to utilize a nucleating agent for the nylon. Talc is the preferred nucleating agent. For this purpose about 0.5 percent to 1.5 percent or more talc by weight of the nylon is incorporated into the sheet. Preferably, the sheet contains about 1 percent talc based on the weight of the nylon. Talc or other nucleating agents may alternatively be employed in similar amounts with nylon or other crystalline polymers.

The shielding layer can be a fibrous material or a perforated metal material. The shielding layer should have an elongation to break of at least 8 percent and preferably 8 to 250 percent and an EMI/RFI shielding effectiveness of at least 30 dB and preferably about 40 to 75 dB.

Graphite fiber mats are useful as a shielding layer meeting the stamping and shielding requirements of the composite of the present invention. The graphite mat is preferably 0.2 to 2 oz/ft$^2$. The graphite mat preferred in the composite of the present invention is about 0.5 oz/ft$^2$. The graphite fibers can be continuous or chopped. Clipped fibers preferably are greater than 0.5 inches in length. The mats can be needled together or held together by a binder resin.

A more preferred material is nickel coated graphite mat. The nickel coating is preferably about half the weight of the final fiber. The nickel can be from 0.1 to 2 times the weight of the graphite.

Metal fibers are also useful in the shielding layer. The metal fibers can be in the form of a non-woven metal fiber mat. A preferred metal fiber mat is a steel fiber mat which is 1 oz/ft$^2$ preferably 0.1 to to 2 oz/ft$^2$. Fibers are useful having a diameter down to 2 microns and can be used having a diameter from 2 to 25 microns. Steel fibers can be used in continuous form in nonwoven mat or in chopped form in mat but are preferably to be woven into a polymeric fabric such as polyamide fabric.

Shielding layer can be made of knitted metal wire mesh. The metal can be any conducting metal and is preferably aluminum or steel. A particularly preferred metal for use in the present invention is tin coated copper clad steel. This material is available from Tecknit ® EMI Shielding Division. The most preferred knitted wire mesh is this tin coated copper clad steel. The thickness of that layer is about 0.5 mm (0.02 in. thick). It is approximately 745 g/100 meters (8.0 oz/100 ft.). The elongation of this material is about 100% making it particularly useful in stamping applications. This material is indicated to have a total shielding effectiveness up to 120 dB. In addition to tin coated copper clad steel knitted mesh wires available in brass, brass having silver plate, aluminum and Monel. Further information is relating to wire mesh made by Tecknit ® is available in their data sheets No. A-230, A-200 and data sheets 711 all incorporated by reference. Reference is made to FIG. 4 showing a typical metal knit design which can undergo an elongation of up to 8 to 250 percent without holes forming in the layer.

Perforated metal layers are also useful as shielding layers. The perforations can be elongated cuts as shown in FIG. 5 which open to form holes as shown in FIG. 6 upon being elongated. The perforations should be sufficient so that the elongation of the piece meets the criteria needed for the shielding layer of the present invention. Perforated metal layers can be 2 to 10 mils thick, and preferably from 3 to 5 mils thick.

The perforations can be in a regular or irregular pattern. Upon stamping the metal layers to form perforations there are preferably no holes made in the metal layer. Rather the perforations are slits in the metal. Preferably, the slits are linear along parallel lines as shown in FIG. 5. There should be sufficient numbers of slits to allow for elongation to be in the above indicated range. Upon elongation there should be a sufficient area of metal coverage to maintain the desired shielding effectiveness as indicated above. The percent metal coverage remaining upon elongation after stamping should be from 30 to 45 percent, preferably 30–80 percent and more preferably 30 to 100 percent based on the total area of the metal layer. A preferred perforated sheet is an aluminum sheet having 8–10 mils between cuts and between parallel lines of cuts. Cuts in this embodiment are from 8 to 14 mils long.

In considering the above shielding layers, it is noted that although there are openings within the layers, the shielding layers have a shielding effectiveness above 30 dB.

A preferred shielding layer is a metal screen. The metal screen can be woven and the screen wire can be made of any suitable metal including but not limited to brass, copper, aluminum and steel. The metal screen must have an elongation to break of at least 8 percent. The metal wire diameter is preferably from 0.001 inches to 0.03 inches and more preferably from 0.005 inches to 0.02 inches. The weave is preferably from 5 to 25 wires per inch by 5 to 25 wires per inch and more preferably from 10 to 20 wires per inch by 10 to 20 wires per inch.

The reinforcing layer can be made of a thermoplastic polymer and a reinforcing means. The reinforcement means may be one or more fabric layers which are laminated with polymers or embedded within polymers. The fibers in the laminate body can be in the form of filaments, threads, yarns, rovings, chopped fiber, scrim, swirl mat, woven rovings, cloth and the like. The preferred fibrous reinforcements are mineral fibers such as glass fiber. Glass fiber provides optimum strength characteristics and is readily available in many forms.

Fibrous swirl mats used as reinforcement in the laminate or in the fabric veil are usually used in an impregnated form. These impregnated fabrics are generally treated with a resin solution to both bind the fibers and wet the fibers. The resinous plastic used to impregnate or coat the fabric or fibers used in the laminate body or fabric veil of the present invention can include both thermosetting and thermoplastic resins. The resinous plastic includes the same thermoplastics used in the thermoplastic layer. Illustrative of the thermosetting resins are: crosslinked or crosslinkable epoxy resins, polyester resins, polyurethane resins, olefin polymers, phenolic resins and the like. Illustrative of thermoplastic resins are uncrosslinked olefins such as ethylene polymers, propylene polymers, butene polymers and vinyl polymers. Intended to be included with this definition are both the homopolymer and copolymer resins.

The reinforcing layer can contain a long glass reinforcing mat preferably weight from 0.1 to 16 oz/ft$^2$. The mat is preferably encased in a thermoplastic matrix containing an extruded basis 50 to 100 percent thermoplastic resin, and from 0 to 50 percent particulate filler.

Reference is made to FIGS. 1 through 3 showing embodiments of the stampable thermoplastic composite of the present invention. FIG. 1 shows a thermoplastic layer 1 adjacent to a shielding layer 2. FIG. 2 shows the shielding layer 2 embedded within a thermoplastic layer 3. Optionally, the stampable thermoplastic composite of the present invention can contain a reinforcing layer 4 as shown in FIG. 3.

FIG. 3 shows a preferred embodiment of a reinforced stampable thermoplastic composite of the present invention. The thermoplastic composite has two thermoplastic layers 1 and a reinforcing layer generally shown as 3 containing two fiberglass mats 4 embedded in a thermoplastic 5. The reinforcing layer has opposite surfaces and at least one and as shown both opposite surfaces adjoin a thermoplastic layer 1. The shielding layers 2 are located between the thermoplastic layers and the reinforcing layers.

Reference is made to FIG. 8 which illustrates the method to produce a reinforced thermoplastic composite shown in FIG. 3. The preferred reinforced stampable thermoplastic composite is a laminate comprising a thermoplastic layer, a reinforced layer comprised of a long glass mat embedded in a thermoplastic matrix, which can optionally contain particulate filler and a shielding layer. The preferred thermoplastic in the thermoplastic layer and surface polymer reinforcing layer is polycaprolactam. Processing conditions in the description that follows are made considering the polymer to be polycaprolactam. The laminate body is made by a process described in U.S. Pat. No. 4,240,857, hereby incorporated by reference. The reinforcing layer is at least one long fiberglass nonwoven mat embedded in a polycaprolactam matrix and the thermoplastic layer is a sheet of polycaprolactam containing filler.

A mixture of thermoplastic resin such as polycaprolactam, short glass and particulate filler and is extruded same through the die of extruder 16. The extrudate passes from the die to the nip of rolls 71 and 76 of roller stack 17. Roll 71 optionally has an engraved pattern or roughened surface. Roll 76 is preferably embossed. Preferably, a polymer film 31 such as a polyepsiloncaprolactam film is fed from polymer film roll 32 onto roll 71 to the nip of rolls 71 and 76. A fiber veil 33 such as a fiberglass veil is preferably fed from fiber roll 34 on to the polymer film 31 on roll 71. The layer of polymer film 31 and fiber veil 33, with the polymer film 31 located between roll 71 and fiber veil 33 pass to the nip of rolls 71 and 76. The extrudate passes to the nip of rolls 71 and 76, with the fiber veil between the polymer film and the extrudate. The polymer film and fiberglass veil are at room temperature. A sheet 15 is produced which is preferably embossed by roller 71 of stack 17 so as to form an embossed surface 72 thereon containing a plurality of projections 74. Sheet 15 has the fiber veil 33 laminated between the polymer extrudate and the polymer film 31 on surface 75 opposite the side containing projections 74. Sheet 15 becomes a surface portion of the laminate.

A similar thermoplastic sheet 13 is a surface portion produced from extruder 11 and embossed in similar fashion as sheet 15 by roller 73 of stack 14. In the FIG. 8 sheet 13 does not contain a fiber veil and polymer film layer. This sheet 13 can optionally have a layer of fiber veil and outer layer of polymer film in the manner of sheet 15.

The reinforcing layer of the laminate is a layer of fiberglass mat embedded in thermoplastic. A third extruder 19 feeds a thermoplastic sheet 20 into laminating rolls 21 simultaneously with sheets 13 and 15, and long glass mat or mats 23 which are fed from roll or rolls 24. Sheet 20 should be in a molten condition at the point where the sheets converge on the rolls 21 and sheets 13 and 15 are preferably below the melting point of the polymer so that projections 74 position the glass mat or mats 23 within the molten sheet 20 during impregnation of the mat(s) 23 by the sheet 20. Roll temperatures depend on the polymer and vary with line speed. In this manner, the long glass reinforcing mat becomes substantially encased in the sheet 20 and does not affect surface qualities of sheets 13 and 15 when they are laminated together. The sheet is subsequently cut with cutter mechanism 26 on conveyor 27 and fed to stacking table 28.

In the embodiment shown in FIG. 8 two shielding layers are laminated to form a composite of the type shown in FIG. 3. Shielding layers 40 are fed from shielding layer rolls 41 to the nip of rolls 21(a) and 21(b) in roll stack 21. The shielding layers 40 are fed between surface sheets 13 and 15 and reinforcing mats 23.

The clearance between rolls 21(a) and 21(b) is less than the combined thickness of the four components 13, 15, 20 and 23. (Thickness of mat 23 is measured under little or no compression.) This causes impregnation of mat 23 by sheet 20, and lamination of the resulting product to sheets 13 and 15.

The temperature of the sheet 20 is preferably above (at least 10° C. above) the thermoplastic melting point to provide adequate residual heat to allow for cooling of sheet 20 between the extruder die 30 and the roll stack 21 and allow the glass mat to be uniformly impregnated thereby. Preferably, the sheet is 50° C. to 100° C. above the polymer melting point at the point of convergence between rolls 21(a) and 21(b). Heating the sheet to a high temperature in the extruder may cause degradation of the polymer and results in excessive energy consumption. Lower temperatures result in inadequate impregnation of the mat 23 by sheet 20, including inadequate flow of the polymer into the interstices of the glass mat, inadequate bonding of sheets 13 and 15 to sheet 20, and inadequate binding of the fibers to the polymer resulting in poor physical properties in the final product. Processing conditions particularly for polyepsiloncaprolactam are disclosed in U.S. Ser. No. 375,239 filed May 5, 1982, hereby incorporated by reference.

The pressure applied by rolls 21(a) and 21(b) is preferably in the range from 100 to 1500 pounds per linear inch, and preferably from 150 to 400 pounds per linear inch, to ensure adequate bonding of the layers and impregnation of the glass mat 23 by sheet 20. Rolls 21(a) and 21(b) must have adequate diameter and wall thickness and bearings of sufficient load bearing capacity to prevent excessive deflection of rolls 21(a) and 21(b). Excessive deflection of rolls 21(a) and 21(b), that is deflection of the order of about 3 thousandths inch or more, can result in nonuniform impregnation of glass mat 23 by sheet 20, nonuniform bonding of sheets 13 and 15 to sheet 20, nonuniform surface appearance, and non-uniform thickness of sheet 25.

Sheet 13, after leaving embossing stack 14, contacts roll 21(d) and then roll 21(a). Sheet 15, after leaving embossing stack 17, contacts roll 21(c) and then roll 21(b). Rolls 21(c) and 21(d) are maintained at a temperature close to but below the polymer melting point, preferably 5° to 40° C. below the polymer melting point. Rolls 21(a) and 21(b) are maintained at a temperature 10° to 70° C. below the polymer melting point. The temperatures of rolls 21(a), 21(b), 21(c) and 21(d) and infrared heaters 30(a), 30(b) are adjusted so that the temperature of sheets 13 and 15 is high enough to achieve strong bonding of sheets 13 and 15 to sheet 20, but not so high as to result in sticking of sheet 13 to roll 21(d) or 21(c) or of sheet 15 to roll 21(a) or 21(b), softening of projections 74 or degradation of the surface quality of sheet 25.

Cooling rolls, such as rolls 29(a) and 29(b), can be used to quickly lower the temperature of laminate 25 sufficiently for easy cutting on cutter mechanism 26.

The stampable thermoplastic sheets of the present invention containing a shielding layer can be stamped by methods known in the art to stamp stampable thermoplastic sheet blanks and not have holes torn in the shielding layer. In particular polyamide, preferably polyepsiloncaprolactam sheets are heated to from about 450° F. to about 700° F. and preferably 500° F. to 600° F. and stamped in a stamping press without having holes torn in the shielding layer.

Several examples are set forth to illustrate the nature of the invention in the manner of carrying it out. However, the invention should not be considered as being limited to the details thereof.

EXAMPLES

A variety of samples were tested for their level of shielding electromagnetic waves in the range of 20 to 200 megahertz (MHz) and 200 to 1000 MHz.

Testing was conducted in a shielded room 12 feet by 20 feet by 8 feet. A shielded box 5 feet by 5 feet by 5 feet was within the shielded room. The box had a 4 foot by 4 foot sample opening. A 4 foot by 4 foot sample mount plate fit the opening. The samples to be tested were mounted in a 9 inch by 9 inch hole in the plate. In each case a matching pair of antennas was used. One antenna inside the box gave off a signal which was received by the antenna outside of the box. In the 20 to 200 MHz range EMCO 3109 Balun Biconical antennas were used. In the 200 to 1000 MHz range Singer Log Spiral CLS-105A antennas were used.

An EIN #600L RF 24db power amplifier was used to generate the signal. In the 20 to 200 MHz frequency range an RF Power Labs, Inc. #220-IK60C 1000 watts wideband RF Amp was additionally used to generate the signal.

A Hewlett Packard 8558B Spectrum Analyzer with a Hewlett Packard 8444A tracking generator (0.5-1300 MHz) was used to analyze the signal received. A Hewlett Packard 8640B signal generator was used to calabrate the system. The results wre recorded on a Hewlett Packard 7047A X-Y recorder.

Each scan of the frequency ranges took 50 seconds. Prior to each scan a run was made with the 9 inch by 9 inch sample hole opened. The difference between the measured decibels passing through the open hold and the decibels passing through the sample at each frequency is the shielding effectiveness at that frequency. Runs were made over the whole range or spectra of frequencies. A control run was made covering the sample hole with a sheet of aluminum ¼ inch thick to determine the maximum shielding effectiveness that can be expected.

Samples were tested in the following configurations:
1. The shielding layer was tested alone prior to lamination.
2. A flat lamination of one layer of shielding layer in a reinforced thermoplastic laminate was tested. The laminate contained two surface layers which was made of 50% polyepsiloncaprolactam, 30% short glass fibers, 19% glass microspheres and 1% talc. These layers were approximately 40 mils thick. There was a center reinforcing layer containing two plies of long fiberglass mat encased in a matrix of polyepsiloncaprolactam containing 29% based on the weight of the matrix composition of glass microspheres and 1% talc based on the matrix composition. The total thickness was about 150 mils thick. The shielding layer was located between one surface layer and the center layer as shown in FIG. 3 with one shielding layer removed.
3. A flat lamination of two shielding layers in a reinforced thermoplastic laminate was tested. The laminate had the same contents as in Configuration 2 with the second shielding layer on the side of the center reinforcing layer opposite the first shielding layer and between the opposite side of the reinforcing layer and the opposite surface layer as shown in FIG. 3.

The flat laminates were heated in an infrared oven to 600° F. The semi molten material was then stamped in a 500 ton press to form and cool the laminate. The shaped article was removed and trimmed for testing. During stamping, the composite laminate was positioned with the shielding layer away from the male die tool. Two molds were used. One was a dome five inches in diameter and 1 198 inches deep at the center. The second was a box mold 6 inches by 6 inches by 3 inches deep. The following configurations were made:
4. Configuration 2 was stamped into the bowl shape.
5. Configuration 3 was stamped into the bowl shape.
6. Configuration 2 was stamped into the box shape.
7. Configuration 3 was stamped into the box shape.

Various shielding layers were tested in the various configurations and results are shown in FIGS. 9 to 15. The numbers on the Figures correspond to the above configurations.

EXAMPLE 1

Figure 9:
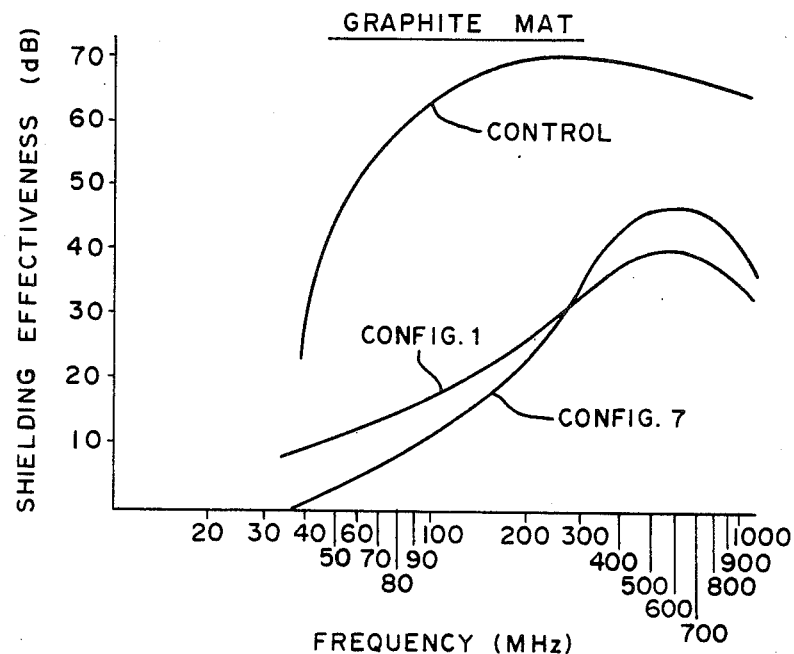

A 0.5 oz./ft$^2$ graphite mat having 100% carbon fibers of about one inch in length in a random pattern to form a sheet was used as a shielding layer. The shielding layer was tested in Configurations 1 and 7. The results are shown in FIG. 9.

EXAMPLE 2

Figure 10:
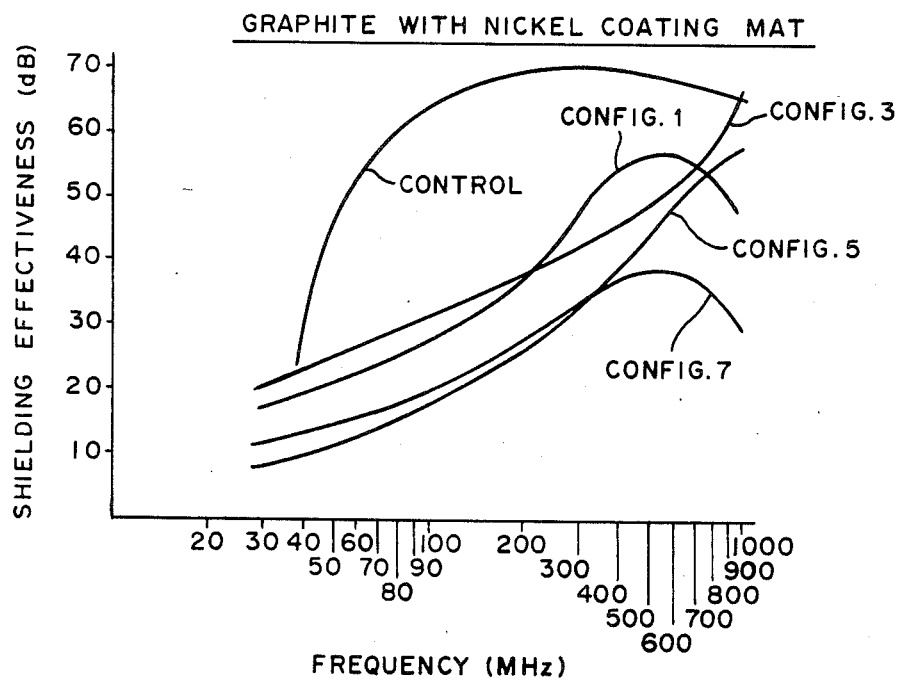

A 0.5 oz/ft nickel coated graphite mat having 100% carbon fibers of about one inch in length coated with nickel. The mat was about 50 percent by weight nickel. The fibers were in a random pattern to form a sheet. The nickel coated graphite mat was tested in Configurations 1, 3, 5 and 7. The results are shown in FIG. 10.

EXAMPLES 3-5

Perforated aluminum sheets were tested as a shielding layer. The metal sheet were supplied by Delker Corp. The sheets had parallel lines of slits. A sheet is schematically shown in FIG. 5. The description of the sheets and configurations tested are summarized as follows. The lengths are in mils.

| Example | Thickness | Slit Length | Distance Between Parallel Lines of Slits | Configuration |
|---|---|---|---|---|
| 3 | 4 | 77 | 7 | 1, 6 |
| 4 | 4 | 125 | 10 | 1, 6 |
| 5 | 5 | 475 | 20 | 1, 6, 7 |

Figure 11:
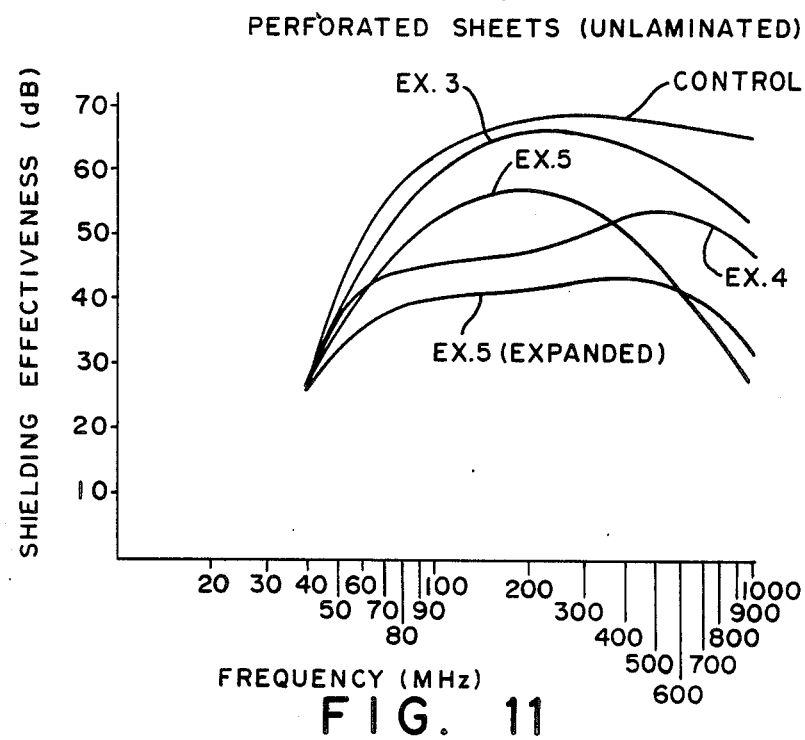
Figure 12:
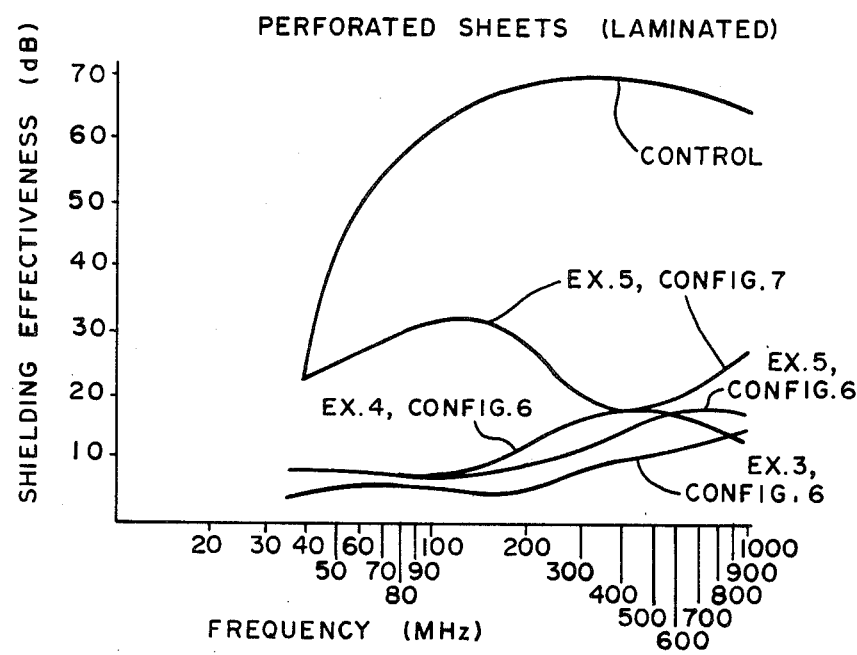

The sheets were tested in various configurations. FIG. 11 shows the results for Configuration 1. The sheet of Example 5 was tested with the slits closed and with the slit opened, i.e., the sheet expanded. Examples 3-5 were tested in Configurations 6 and Example 5 was also tested in Configuration 7. The results of testing of Examples 3-5 using Configuration 6 and 7 are shown in FIG. 12. The results show that at least two layers of the perforated sheets used in this Example are required.

EXAMPLES 6-7

The shielding layer was made of a metal mesh net made of tin coated, copper clad steel wire sold as Tecknit® by the Technit® EMI Shielding Division. The wire mesh used was the same type as used in the described Tecknit's Data Sheet No. A-200 hereby incorporated by reference. The shielding mesh is made of 0.0045" diameter wire. Large mesh (100 needle mesh) was tested in Example 6 and small mesh (130 needle mesh) was tested in Example 7.

Figure 13:
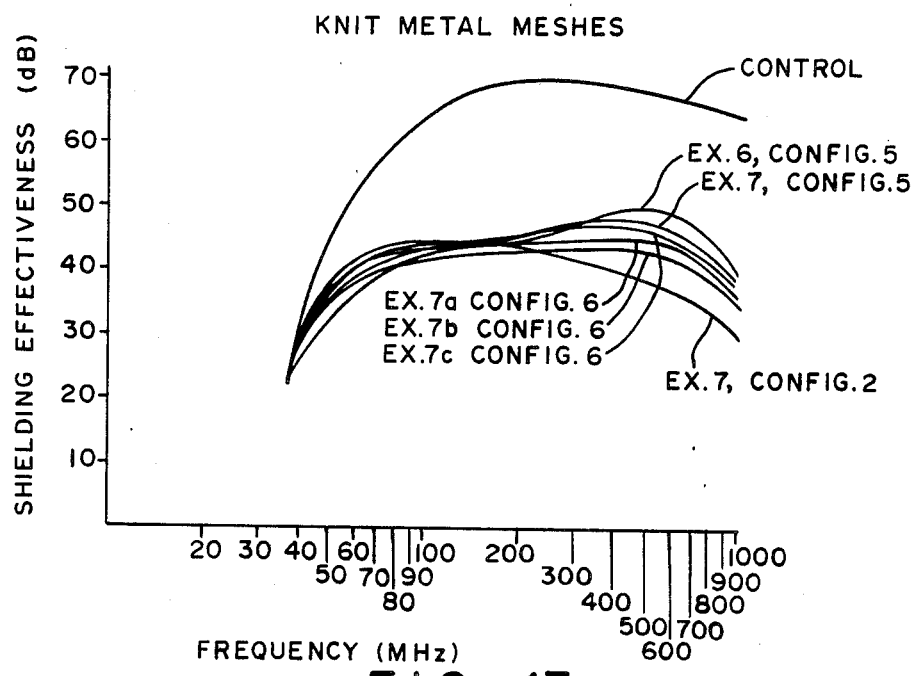

The large mesh shielding material was tested as Example 6 in Configuration 5. The small mesh shielding material was tested as Example 7 in Configurations 2, 5 and 6. The results are shown in FIG. 13. Configuration 6 of Example 7 was repeated with the shielding layer between the outer layer and center reinforcing layer as Examples 7a and 7b. In Example 7c, Configuration 6 was run with the shielding layer laminated to the outside surface of the box.

EXAMPLE 8

Figure 14:
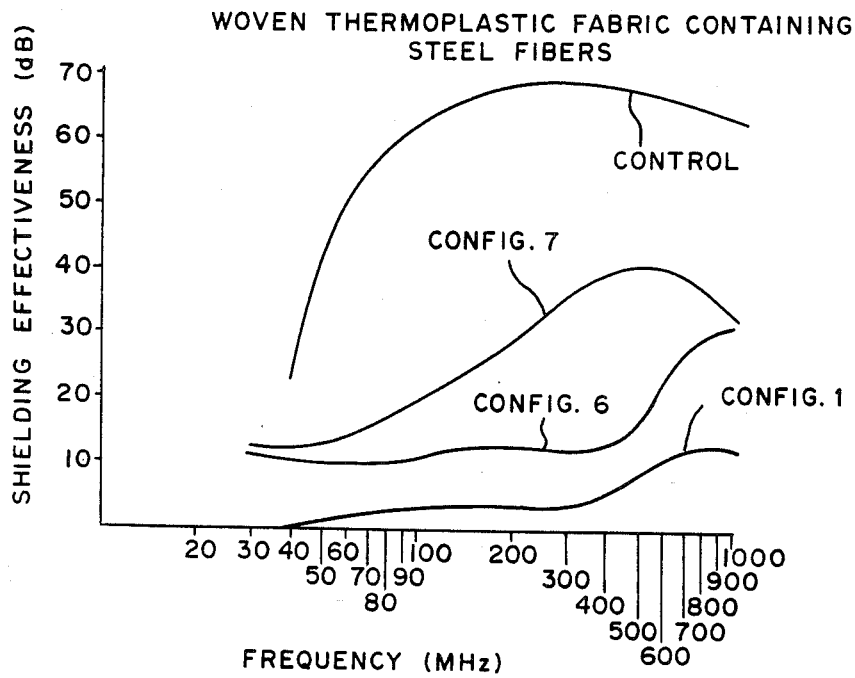

A shielding layer was made of woven polyester (polyester terephthalate) having 16 percent stainless steel fibers of about 2 microns in diameter blended into the yarn. The fabric was about 15 mils thicks and was 0.130 g/square inch. The fabric was tested in Configurations 1, 6 and 7. The results are shown in FIG. 14. This material is particularly interesting. The shield in the stamped boxes had improved shielding effectiveness as compared to the unlaminated shielding material. This is believed to be caused by the thermoplastic fibers melting and the metal fibers making contact. The invention also includes laminations of such metal fabric material where two or more layers are adjacent to each other to form more of a three dimensional metal fiber network.

EXAMPLE 9

A brass screen having a wire diameter of 0.011 inches and 19 wires per inch by 16 wires per inch was used as the shielding material in Configuration 6. The results are summarized in FIG. 15.

While examplary embodiments of the invention have been described, the true scope of the invention is to be determined from the following claims:

What is claimed is:

1. A stamped thermoplastic composite comprising:
    at least one thermoplastic layer; and at least one shielding layer, the shielding layer comprising at least one layer of thermoplastic woven fiber containing metal fiber and having an elongation to break of at least 8 percent and an EMI/RFI shielding effectiveness of at least 30 dB, and the stamped composite having been elongated at least 8 percent without holes formed by tearing of the shielding layer during stamping.

2. The stamped thermoplastic composite as recited in claim 1 wherein the shielding layer is adjacent to the thermoplastic layer.

3. The stamped thermoplastic composite as recited in claim 1 wherein the shielding layer is embedded in the thermoplastic layer.

4. The stamped thermoplastic composite as recited in claim 1 wherein the thermoplastic layer is a polyamide.

5. The stamped thermoplastic composite as recited in claim 4 further comprising a reinforcing layer.

6. The stamped thermoplastic composite as recited in claim 4 wherein the reinforcing layer contains 50 to 100 percent of a thermoplastic polymer on an extruded basis, from 0 to 50 percent of particulate filler, on an extruded basis, and a long glass fiber mat.

7. The stamped thermoplastic composite as recited in claims 4 and 5 wherein the thermoplastic layer comprises from 40 to 100 percent thermoplastic polymer, from 0 to 50 percent particulate filler and from 0 to 45 percent short fibers.

8. The stamped thermoplastic composite as recited in claim 5 wherein the shielding layer is located between the thermoplastic layer and the reinforcing layer.

9. The stamped thermoplastic composite as recited in claim 8 wherein the reinforcing layer has opposite surfaces and at least one opposite surface adjoins a thermoplastic layer and where there is a shielding layer between at least one thermoplastic layer and the reinforcing layer.

10. The stamped thermoplastic composite as recited in claim 1 wherein the shielding layer has an elongation to break of from 8 to 250 percent.

11. The stamped thermoplastic composite as recited in claim 1 wherein the composite has an EMI/RFI shielding effectiveness of from 40 to 75 dB.

12. The stamped thermoplastic composite as recited in claim 1 wherein the shielding layer comprises at least two adjacent layers of thermoplastic woven fiber containing metal fiber.

13. A stampable thermoplastic composite comprising:
    at least one thermoplastic layer; and at least one shielding layer, the shielding layer comprising at least one layer of thermoplastic woven fabric containing metal fiber having an elongation to break of at least 8 percent, and the composite having an EMI/RFI shielding effectiveness of at least 30 dB.

14. The stampable thermoplastic composite as recited in claim 13 wherein the shielding layer comprises at least two adjacent layers of thermoplastic woven fiber containing metal fiber.

15. The stampable thermoplastic composite as recited in claim 13 wherein the shielding layer comprises at least two adjacent layers of thermoplastic woven fiber containing metal fiber.

16. A method comprising the step of stamping a thermoplastic composite comprising:
at least one thermoplastic layer; and at least one shielding layer, the shielding layer comprising at least one layer of thermoplastic woven fiber containing metal fiber and having an elongation to break of at least 8 percent and an EMI/RFI shielding effectiveness of at least 30 dB, and the stamped composite having been elongated at least 8 percent without holes formed by tearing of the shielding layer during stamping.

* * * * *